United States Patent [19]

Stoddard et al.

[11] Patent Number: 5,684,427
[45] Date of Patent: Nov. 4, 1997

US005684427A

[54] BIPOLAR DRIVER CIRCUIT INCLUDING PRIMARY AND PRE-DRIVER TRANSISTORS

[75] Inventors: Robert J. Stoddard, Lincoln; Daniel P. Orange, II, Worcester, both of Mass.; Roger C. Peppiette, Colinton, Scotland

[73] Assignee: Allegro MicroSystems, Inc., Worcester, Mass.

[21] Appl. No.: 588,060

[22] Filed: Jan. 19, 1996

[51] Int. Cl.$^6$ .............................................. H03K 17/615
[52] U.S. Cl. ........................................ 327/483; 327/108
[58] Field of Search .................................. 327/108, 442, 327/478, 482, 483, 490, 538, 539, 575; 323/313, 315

[56] References Cited

U.S. PATENT DOCUMENTS

| | | | |
|---|---|---|---|
| 3,519,851 | 7/1970 | Groner | 307/237 |
| 3,562,557 | 2/1971 | Gates | 307/255 |
| 3,648,073 | 3/1972 | Sams et al. | 307/246 |
| 3,736,572 | 5/1973 | Tu | 340/173 DR |
| 3,867,649 | 2/1975 | Cochran | 307/268 |
| 4,222,100 | 9/1980 | Jones | 363/124 |
| 4,454,432 | 6/1984 | Wood | 307/456 |
| 4,572,970 | 2/1986 | Allen et al. | 327/483 |
| 4,654,544 | 3/1987 | Wheeler | 307/270 |
| 4,754,158 | 6/1988 | Halberstein | 327/483 |
| 4,791,313 | 12/1988 | Kuo et al. | 307/268 |
| 4,963,802 | 10/1990 | Gross et al. | 318/294 |
| 5,075,568 | 12/1991 | Bilotti et al. | 307/270 |
| 5,113,305 | 5/1992 | Raciti et al. | 361/92 |
| 5,376,833 | 12/1994 | Chloupek | 327/110 |
| 5,394,038 | 2/1995 | Sobue et al. | 327/432 |
| 5,404,051 | 4/1995 | Kobayashi | 327/483 |
| 5,424,671 | 6/1995 | Hohne et al. | 327/483 |
| 5,489,861 | 2/1996 | Seymour | 327/483 |

FOREIGN PATENT DOCUMENTS

| | | | |
|---|---|---|---|
| 401276820 | 11/1989 | Japan | 327/483 |
| 3644777 | 7/1988 | United Kingdom | 327/483 |

OTHER PUBLICATIONS

Littauer, Darlington Constant Current Source, Pulse Electronics, pp. 267–269 1965.

Primary Examiner—Timothy P. Callahan
Assistant Examiner—My-Trang Nu Ton
Attorney, Agent, or Firm—Judith C. Crowley

[57] ABSTRACT

A bipolar driver circuit includes a primary driver transistor and an independently controlled pre-driver transistor having an emitter connected to the base of the primary driver transistor and a collector connected to the collector of the primary driver transistor. In one embodiment, the collector of the primary driver transistor is connected to the output terminal of the driver circuit for sinking current from a load and, in another embodiment, the emitter of the primary driver transistor is connected to the output terminal of the driver circuit for sourcing current to a load. A first current source is connected to the base of the primary driver transistor and a second current source is connected to the base of the pre-driver transistor. The current sources are commonly controllable by an input signal. Also provided is an inverse conduction prevention circuit for preventing the pre-driver transistor from diverting base current from the primary driver transistor in the sink driver embodiment.

17 Claims, 8 Drawing Sheets

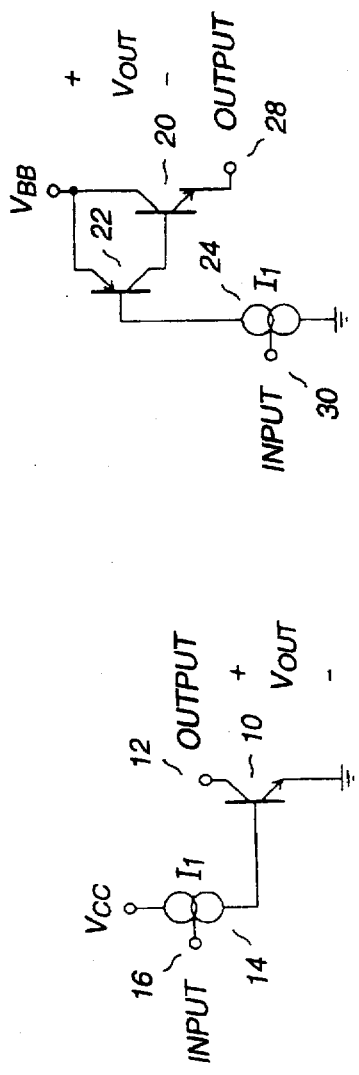
Fig. 1
(PRIOR ART)
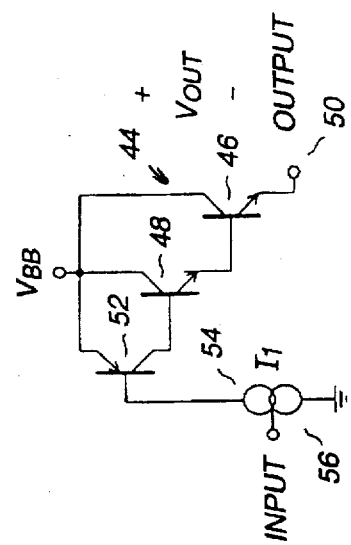
Fig. 2
(PRIOR ART)
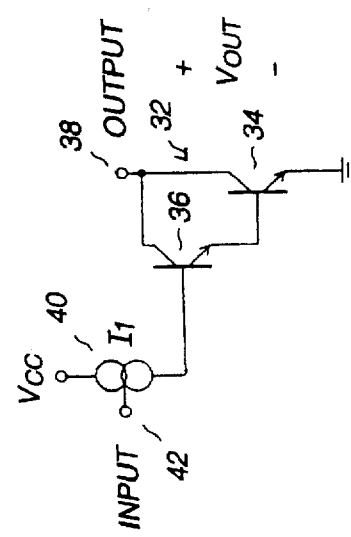
Fig. 3
(PRIOR ART)
Fig. 4
(PRIOR ART)

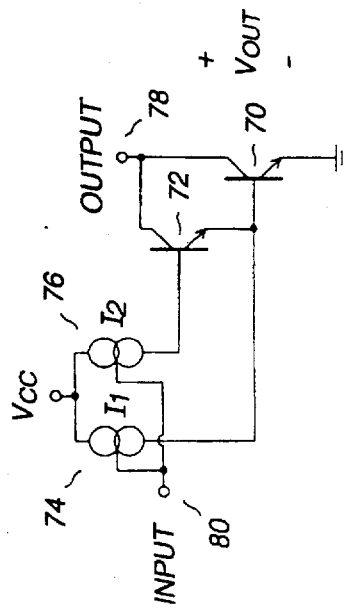
Fig. 5
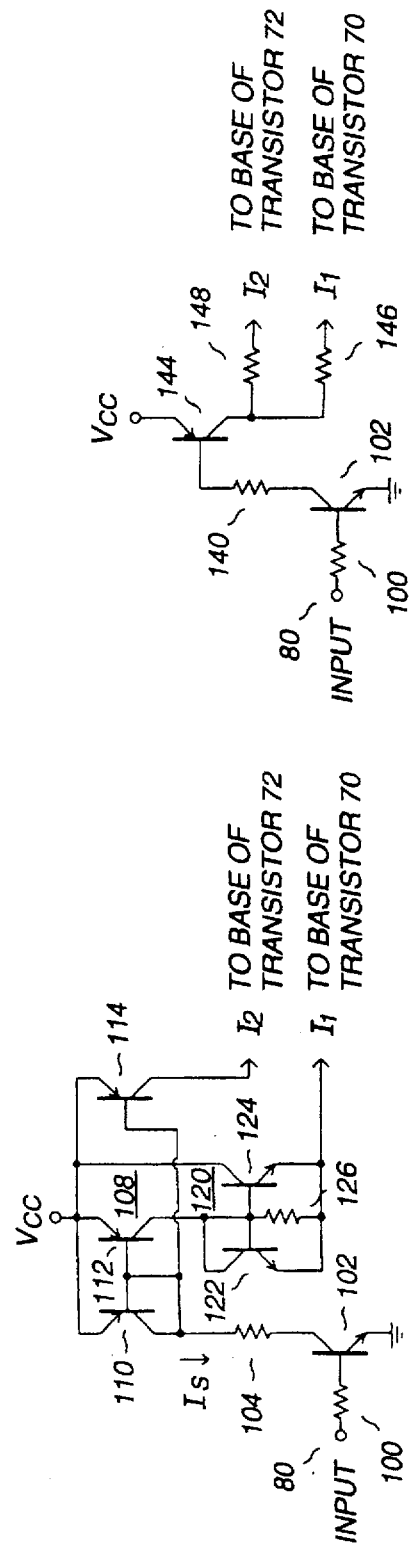
Fig. 8
Fig. 7

BIPOLAR DRIVER CIRCUIT INCLUDING PRIMARY AND PRE-DRIVER TRANSISTORS

FIELD OF THE INVENTION

This invention relates generally to bipolar driver circuits and more specifically, to a bipolar driver circuit utilizing a primary driver transistor and an independently controlled pre-driver transistor.

BACKGROUND OF THE INVENTION

Bipolar driver circuits are often used to drive loads having high peak current requirements. For example, in applications in which the load is a motor, relatively high peak currents are often required during acceleration and deceleration.

One type of conventional driver circuit utilizes an NPN bipolar transistor through which the output, or load, current flows. A sink driver circuit of this type is shown in FIG. 1 to include an NPN transistor 10 having a collector connected to an output terminal 12 of the circuit for further coupling to a load and an emitter connected to ground. A current source 14 is connected to the base of transistor 10 and is controllable via an input signal applied to an input terminal 16. When the current source 14 is turned on, base current is supplied to the NPN transistor 10 so as to saturate the transistor 10. With this arrangement, the NPN transistor 10 sinks current from a load connected to the output terminal 12.

A source driver circuit of the type utilizing an NPN bipolar transistor and a PNP bipolar transistor is shown in FIG. 2 to include an NPN transistor 20 having an emitter connected to an output terminal 28 of the circuit for further coupling to a load and a collector connected to a supply voltage bus $V_{BB}$. A current source 24 is connected to the base of a PNP transistor 22 and is controllable in response to an input signal applied to an input terminal 30. When the current source 24 is on, the emitter junction of the PNP transistor 22 is forward biased, causing the transistor 22 to supply base current to the NPN transistor 20. Under this condition, transistor 20 sources current to a load connected to the output terminal 28.

The bipolar driver circuits depicted in FIGS. 1 and 2 have relatively low output voltage drops ($V_{OUT}$). In the case of FIG. 1, for low to moderate levels of load current, transistor 10 will saturate producing a low collector-to-emitter voltage drop ($V_{CE(SAT)}$) which is equal to the output voltage drop $V_{OUT}$. In the case of FIG. 2, for low to moderate levels of load current, transistor 22 will saturate and transistor 20 will function as an emitter follower producing a total driver voltage drop of $V_{OUT}=V_{CE(SAT)}+V_{BE}$. A low driver voltage drop advantageously minimizes the component of driver power dissipation due to conduction losses, namely $I_{OUT}*V_{OUT}$. However, the circuits of FIGS. 1 and 2 have limited current gain capability. To maintain a low output voltage at higher currents, the transistor's sizes may need to be increased and/or a concomitantly large base current, $I_1$, may be required. Such increased current $I_1$ not only has the undesirable effect of increasing the driver's power dissipation, but the cost of the system in which the driver circuit is used also generally increases due to the increased $V_{CC}$ or $V_{BB}$ power supply demands. In order to maintain acceptable power dissipation levels and power supply demands, the output current capability of the circuit may be limited. Moreover, in the case of the source driver circuit of FIG. 2, the PNP transistor 22 may occupy significant circuit area in order to provide a large value of base drive current to the transistor 20.

Darlington transistor pairs have also been used in bipolar driver circuits. An illustrative Darlington pair 32 arranged to provide a sink driver circuit is shown in FIG. 3 to include an NPN power transistor 34 and a pre-driver NPN transistor 36. A current source 40 is connected to the pre-driver transistor 36 in order to selectively supply base drive current to the transistor 36. When the current source 40 is on, base current is supplied, rendering the pre-driver transistor 36 conductive. Conducting transistor 36, in turn, supplies base current to transistor 34. With this arrangement, load current flows from the output terminal 38 through transistors 36 and 34 to ground.

A source driver circuit of the type including a Darlington pair 44 is shown in FIG. 4 to include an NPN power transistor 46 and a pre-driver NPN transistor 48. A current source 54 is connected to the base of a PNP transistor 52 and is controllable by an input signal applied to an input terminal 56. When the current source 54 is on, transistor 52 conducts and supplies base current to the pre-driver transistor 48. With transistor 48 thus conducting, base drive current is supplied to transistor 46, thereby permitting load current to be supplied through transistors 52, 48 and 46 to a load connected to the output terminal 50.

Because of the extra current gain (beta or β) afforded by the additional NPN transistor, Darlington transistor pairs advantageously have lower base drive current requirements than saturated bipolar transistors, for the same amount of output current. Thus, driver circuits utilizing a Darlington pair will generally have a lower component of dissipation due to the base drive current $I_1$ than saturated bipolar transistor circuits. On the other hand however, the sink and source drivers of FIGS. 3 and 4 that utilize Darlington pairs inherently have a higher $V_{OUT}$ voltage than the corresponding sink and source drivers shown in FIGS. 1 and 2, respectively. This is because the added NPN transistor that affords the additional current gain also adds an additional forward biased base-to-emitter voltage drop ($V_{BE}$) to the output voltage $V_{OUT}$. This increase in $V_{OUT}$ results in increased power dissipation due to increased conduction losses. For a given silicon transistor area, the circuits shown in FIGS. 1 and 2 typically have lower total power dissipation for low to moderate levels of output current as compared to the circuits in FIGS. 3 and 4 respectively, with the opposite relationship being true at higher output current levels.

SUMMARY OF THE INVENTION

In accordance with the invention, a bipolar driver circuit includes a primary driver transistor having a collector and an emitter, one of which is connected to an output terminal of the driver circuit, and an independently controlled pre-driver transistor having an emitter connected to the base of the primary driver transistor and a collector connected to the collector of the primary driver transistor. A first current source is connected to the base of the primary driver transistor and a second current source is connected to the base of the pre-driver transistor.

In one embodiment, the collector of the primary driver transistor is connected to the output terminal of the driver circuit so as to provide a sink driver circuit and, in another embodiment, the emitter of the primary driver transistor is connected to the output terminal of the driver circuit so as to provide a source driver circuit. A "half-bridge" driver circuit with both sourcing and sinking capability may also be provided in which the above-described source and sink driver circuits are coupled in series, with the output terminal of the driver circuit being provided at the junction between the driver transistors of the source and sink circuits.

With these arrangements, source and sink driver circuits are provided which overcome the shortcomings of conventional driver circuits utilizing either a single NPN bipolar transistor or a Darlington NPN transistor pair. Under relatively low output current conditions, the $V_{CE}$ voltage of the primary driver transistor is low (i.e., approaches zero in the case of the driver embodiments in which the driver transistor is saturated, or approaches a $V_{BE}$ drop in the case of the source driver embodiments that utilize NPN transistors). Such low $V_{CE}$ voltage of the primary driver transistor results in a low output voltage drop and a concomitantly low power dissipation under low output current conditions. When higher output currents are demanded, the pre-driver transistor becomes forward biased to supply additional base current to the primary driver transistor. Under such conditions, significant peak output currents can be achieved without disadvantageously requiring a substantial increase in the current $I_1$. Thus, the presently disclosed driver circuits have a relatively low output voltage drop during low output current operation, in the manner of the bipolar transistor driver circuits of FIGS. 1 and 2, while also providing high peak output currents without requiring substantial $I_1$ current, as in the manner of the Darlington-based circuits of FIGS. 3 and 4.

The first and second current sources, which control the primary driver transistor and the pre-driver transistor, respectively, are commonly controlled. More particularly, the first and second current sources are responsive to a common input signal for turning on and off, so as to effectively turn the driver circuit on and off.

Also described in conjunction with the driver embodiments are inverse conduction prevention circuits for preventing the pre-driver transistor from diverting base current away from the driver transistor, as may occur when the primary driver transistor is saturated causing the pre-driver transistor collector junction to forward bias rendering it conductive in the inverse mode. In one embodiment, the inverse conduction prevention circuit includes a diode-connected transistor in series with a resistor and with the base of the pre-driver transistor. In an alternate embodiment, the inverse conduction prevention circuit includes a Schottky diode connected between the base and collector of the pre-driver transistor.

BRIEF DESCRIPTION OF THE DRAWINGS

The foregoing features of this invention, as well as the invention itself, may be more fully understood from the following detailed description of the drawings in which:

FIG. 1 shows a sink driver circuit known in the art;

FIG. 2 shows a source driver circuit known in the art;

FIG. 3 shows an alternate sink driver circuit known in the art;

FIG. 4 shows an alternate source driver circuit known in the art;

FIG. 5 shows a sink driver circuit in accordance with an embodiment of the invention;

FIG. 7 shows an illustrative current source for use in the sink driver circuit of FIG. 5;

FIG. 8 shows an alternate current source for use in the sink driver circuit of FIG. 5;

DESCRIPTION OF THE PREFERRED EMBODIMENT

Figure 12:
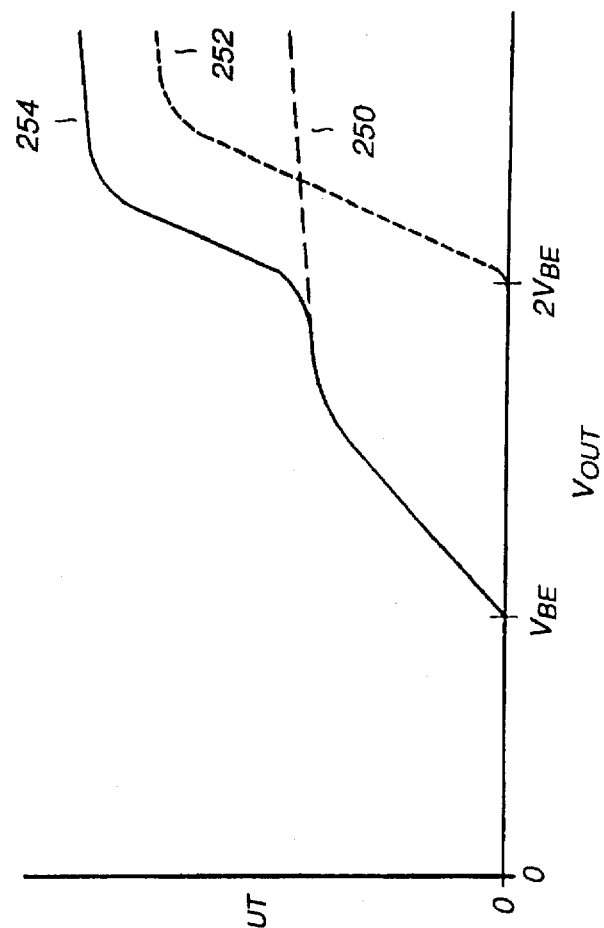
FIG. 12 is a graph of the voltage drop across the driver ($V_{OUT}$) versus the output current ($I_{OUT}$) characteristics associated with the source driver circuits of FIGS. 2, 4 and 11.

Referring to FIG. 5, a sink driver circuit in accordance with an embodiment of the invention is shown to include a primary driver transistor 70 having a collector connected to an output terminal 78 of the driver circuit and an emitter connected to a supply voltage bus, such as ground. The output terminal 78 of the circuit is adapted for coupling to a load. The driver circuit further includes a pre-driver transistor 72 having a collector connected to the collector of driver transistor 70, an emitter connected to the base of driver transistor 70, and a base. In the illustrative embodiment of FIG. 5, both the primary driver transistor 70 and the pre-driver transistor 72 are NPN transistors.

Also provided are first and second current sources 74 and 76, for independently driving the primary driver transistor 70 and the pre-driver transistor 72, respectively. More particularly, the first current source 74 is connected between a supply voltage bus, such as $V_{CC}$ as illustrated, and the base of the primary driver transistor 70 for supplying a first current $I_1$ to the base of transistor 70. The second current source 76 has a first terminal connected to the supply voltage bus $V_{CC}$ and a second terminal connected to the base of pre-driver transistor 72 for supplying a second current $I_2$ to the base of transistor 72.

An input terminal 80 is responsive to an input signal for simultaneously controlling the first and second current sources 74 and 76, respectively, in order to selectively turn on and off such current sources. It will be appreciated by those of skill in the art however, that the current sources 74 and 76 may alternatively be independently controlled. The input terminal 80 may be an internal node of the driver circuit or, alternatively, may be an externally accessible driver circuit terminal.

In operation, when the input signal applied to input terminal 80 causes current sources 74 and 76 to be turned on, base drive current is supplied from the current sources 74 and 76 to the respective transistors 70 and 72, so as to cause such transistors to conduct. With this arrangement, output current is drawn from the output terminal 78 through conducting transistors 70 and 72.

More particularly, under lower output current conditions, primary driver transistor 70 is saturated by base current $I_1$ and the collector junction of the pre-driver transistor 72 is forward biased by $I_2$ since its collector is at a lower voltage than its emitter, rendering the pre-driver transistor conductive in the inverse mode. Because the pre-driver transistor is inversely conductive, some of the base drive current $I_1$ will be diverted from the base to the collector of the primary driver transistor. If the inverse beta of the pre-driver transistor 72 is low, and because the current source $I_2$ is typically much smaller than $I_1$, then the amount of current $I_1$ diverted from the base of the primary transistor 70 may be a small percentage of $I_1$. Under these conditions, the primary driver transistor 70 has sufficient base drive to saturate for low values of load current, resulting in a low output voltage drop and correspondingly low power dissipation. Thus, under light load conditions, the sink driver circuit of FIG. 5 takes on the advantageous low saturation voltage characteristic of the circuit of FIG. 1.

As the output current requirement increases, the limited gain of the primary driver transistor 70 causes its $V_{CE}$ to increase to the point where the collector of transistor 72 is at a higher voltage than the emitter of transistor 72. This causes the collector junction of transistor 72 to reverse bias and the emitter junction of transistor 72 to forward bias. When this occurs, the pre-driver transistor 72 becomes conductive in the forward mode and provides additional base drive current to the primary driver transistor 70. Because the forward current gain of pre-driver transistor 72 is large, current $I_2$ need not be large to allow transistor 72 to provide a substantial amount of base drive current to the primary driver transistor 70 above and beyond the base drive already provided by current source $I_1$.

The circuit of FIG. 5 permits high peak output currents to be accommodated, without the significantly increased base drive current $I_1$ that would be required by the driver circuit of FIG. 1 at the cost of a higher saturation voltage. In this way, the circuit of FIG. 5 is similar to the Darlington-based circuit of FIG. 3.

Figure 6:
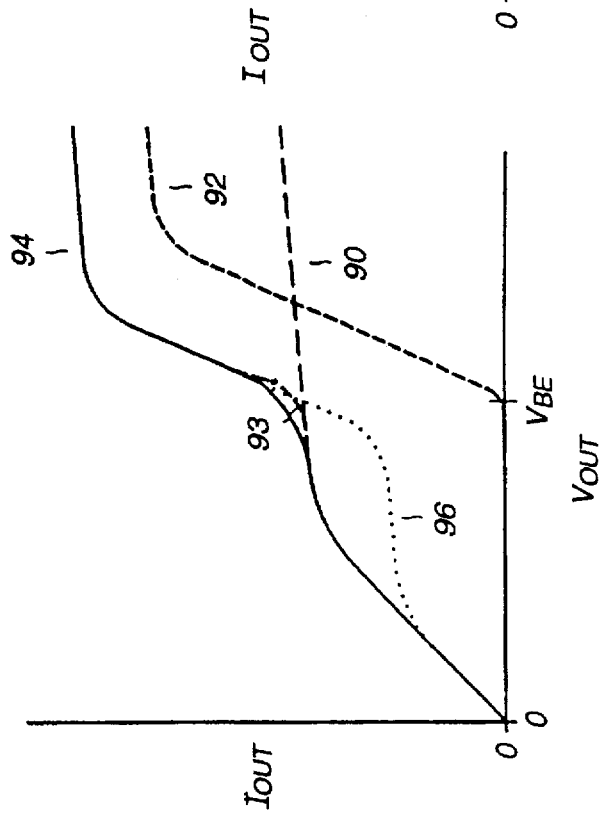
FIG. 6 is a graph of the voltage drop across the driver ($V_{OUT}$) versus the output current ($I_{OUT}$) characteristics associated with the sink driver circuits of FIGS. 1, 3 and 5.

Referring also to FIG. 6, the output current ($I_{OUT}$) versus output voltage drop ($V_{OUT}$) characteristics associated with the prior art driver circuits of FIGS. 1 and 3 and the circuit of FIG. 5 are shown. The dashed line curve 90 illustrates the $I_{OUT}$ vs. $V_{OUT}$ characteristics of the circuit of FIG. 1. As is apparent from curve 90, this circuit is unable to supply high peak output currents. Recall that this circuit requires that a tradeoff be made between the amount of output current that can be accommodated and the acceptable level of current $I_1$.

Curve 92 represents the $I_{OUT}$ vs. $V_{OUT}$ characteristics of the Darlington-based circuit of FIG. 3. While greater peak output currents are achievable with the circuit of FIG. 3 than with the circuit of FIG. 1, the $V_{OUT}$ voltage of the driver circuit of FIG. 3 is higher at low current levels, thereby resulting in increased power dissipation at low current. More particularly, the lowest $V_{OUT}$ voltage associated with the circuit of FIG. 3 is equal to one $V_{BE}$ drop, as shown.

The $I_{OUT}$ vs. $V_{OUT}$ characteristics of the circuit of FIG. 5 are shown by the solid line curve 94 for the case when the reverse beta of transistor 72 is low. As is apparent, highpeak output currents are achieved with this circuit. In fact, the circuit of FIG. 5 can accommodate higher output currents than the Darlington-based circuit of FIG. 3 due to the increased base drive current supplied to the driver transistor 70 by the combination of the conducting pre-driver transistor 72 and the current source $I_1$.

The dotted line curve 96 represents the operation of the circuit of FIG. 5 when the base-to-collector junction of the pre-driver transistor 72 is forward biased causing transistor 72 to inversely conduct, as previously discussed. More particularly, curve 96 represents the case where pre-driver transistor 72 has a high enough reverse beta to divert a relatively large portion of the primary driver transistor base current $I_1$. The exact point at which curve 96 diverts from curve 94 is dependent on the reverse beta of transistor 72 (i.e. the higher the reverse beta, the lower the $I_{OUT}$ level at which curve 96 diverts from curve 94). Where the dotted line curve 96 takes an upward turn, the pre-driver transistor 72 has become forward biased due to the driver transistor 70 coming out of saturation, causing additional base drive current to be supplied to the driver transistor 70. In the embodiments shown and described below in conjunction with FIGS. 9 and 10, the diverting of base current $I_1$ from driver transistor 70 by the pre-driver transistor 72 is prevented by an inverse conduction prevention circuit. The circuits of FIGS. 9 and 10 have $I_{OUT}$ v. $V_{OUT}$ characteristics shown by dot/dash curve 93 in FIG. 6.

In general, a combination of the size of the driver transistor 70 and the amount of current $I_1$ provided by current source 74 determines the value of load current below which transistor 70 will saturate producing a low value of $V_{OUT}$. A combination of the size of the pre-driver transistor 72, the size of driver transistor 70, the value of current source 74 and the value of current source 76 determines the amount of peak output current that the driver circuit can accommodate. The selected size of the transistors 70 and 72 and the amount of current provided by the sources 74 and 76 are likely to be a function of economics in terms of overall circuit size and power supply capability. Furthermore, the total power dissipation capability of the driver is typically limited and thus, the circuit is often designed to take into account the percentage of time spent operating at various current levels so as to minimize the driver's operating temperature. Illustrative values of current $I_1$ supplied by the current source 74 are between approximately 20 mA and 200 mA and illustrative values of current $I_2$ supplied by the current source 76 are between approximately 1 mA and 5 mA. Typical size ratios of the primary driver transistor 70 to the pre-driver transistor 72 are on the order of approximately 5:1 and, more generally, are between 3:1 and 8:1. In one embodiment, the sink driver circuit of FIG. 5 accommodates nominal output currents of up to 800 mA with $V_{OUT}$ less than one $V_{BE}$ drop and output currents of up to 1.5 A with $V_{OUT}$ less than two $V_{BE}$ drops.

The sink driver circuit of FIG. 5 is particularly well suited for applications requiring high output currents of relatively short duration. This is because the average power dissipation is dominated by the low current characteristics. Examples of such applications are driving motors, which require high peak currents for a short duration during startup, and driving incandescent lamps, which require a peak current for a short duration when the bulb is being lit and the filament is cold.

Referring to FIG. 7, an illustrative circuit for providing the current sources 74 and 76 of FIG. 5 is shown. To this end, the circuit of FIG. 7 is shown in connection to the input terminal 80. Input terminal 80 is connected to a resistor 100 which is further connected to the base of an NPN transistor 102. The emitter of transistor 102 is connected to ground and its collector is connected to a resistor 104.

A first current mirror 108 includes PNP resistors 110, 112 and 114, all of which have interconnected bases and interconnected emitters. More particularly, the emitters of transistors 110, 112 and 114 are connected to a supply voltage bus, such as $V_{CC}$ as illustrated, and the bases of such transistors are connected to resistor 104, as shown. The collector of transistor 110 is also connected to resistor 104.

Transistor 112 has a collector connected to a second current mirror 120, including individual NPN resistors 122 and 124. The emitters of transistors 122 and 124 are interconnected, as are the bases of such transistors, as shown. A resistor 126 is connected between the bases and emitters of transistors 122 and 124. Base-to-emitter resistor 126, as well as other base-to-emitter resistors described herein, serve to enhance the switching speed of their respective transistors. The current $I_1$ is provided at the interconnected emitters of transistors 122 and 124, which are further connected to the base of the primary driver transistor 70 (FIG. 5), as specified. Transistor 114 of the current mirror 108 has a collector at which the current $I_2$ is provided and thus, which is connected to the base of the pre-driver transistor 72 (FIG. 5).

In operation, currents $I_1$ and $I_2$ are provided by the circuit of FIG. 7 when an input signal coupled to the input terminal 80 is at a voltage sufficient to forward bias the emitter junction of transistor 102. With transistor 102 conducting, a current $I_S$ is developed through the current path including PNP transistor 110, resistor 104 and transistor 102. The current mirror 108 causes a current proportional to current $I_S$ to be developed through the other transistors 112 and 114 of current mirror 108. The amount of current through transistors 112 and 114 is a function of the current $I_S$, as well as the relative geometries of the transistors 110, 112 and 114.

The mirrored current developed through transistor 114 provides the current $I_2$ to the base of transistor 72 (FIG. 5). The level of current $I_2$ is thus adjustable by varying the current $I_S$ and/or the relative sizes of transistors 110 and 114. The current through transistor 112 sets the base-to-emitter voltage of transistors 122 and 124. Once the emitter junctions of these transistors 122 and 124 are forward biased, transistors 122 and 124 begin to conduct. The amount of current through transistor 124 is a function of the current through transistor 122 and the relative geometries of transistors 122 and 124. For example, in applications where transistors 122 and 124 are the same size, the current through transistor 124 is equal to the level of current through transistor 122; whereas, in applications where transistor 124 is fourteen times as large as transistor 122 for example, the current through transistor 124 is fourteen times the level of the current through transistor 122. Thus, by tailoring the relative sizes of transistors 122 and 124, a desired amount of gain can be achieved by current mirror 120 to provide a desired level of current $I_1$.

Referring also to FIG. 8, an alternative circuit for providing the current sources 74 and 76 of FIG. 5 is shown. Like the circuit of FIG. 7, the input terminal 80 is connected to a resistor 100 which is further connected to the base of an NPN transistor 102. The emitter of transistor 102 is connected to ground and the collector is connected to a series resistor 140. Resistor 140 is further connected to the base of a PNP transistor 144, the emitter of which is connected to the $V_{CC}$ supply voltage bus and the collector of which is connected to a pair of resistors 146 and 148. The current through resistor 146 provides the current $I_1$ to the base of transistor 70 (FIG. 5) and the current through resistor 148 provides the current $I_2$ to the base of transistor 72 (FIG. 5).

In operation, when the input signal applied to the input terminal 80 is at a level sufficient to forward bias the emitter junction of transistor 102, transistor 102 begins to conduct which, in turn, causes transistor 144 to conduct. With transistor 144 in its conducting state, current flows from $V_{CC}$ through transistor 144 and resistors 146 and 148 to the bases of transistors 70 and 72, respectively. The level of currents $I_1$ and $I_2$ can be adjusted by adjusting the values of resistors 146 and 148, respectively. It will be appreciated by those of skill in the art that various circuits are suitable for implementing the current sources 74 and 76 (FIG. 5), in addition to those shown and described in conjunction with FIGS. 7 and 8.

Figure 9:
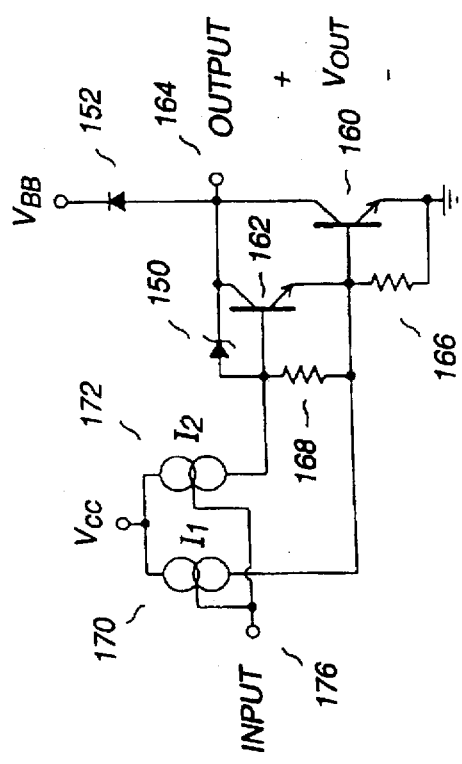
FIG. 9 shows an alternate embodiment of the sink driver circuit of FIG. 5.

Referring to FIG. 9, a further embodiment of the sink driver circuit of FIG. 5 is shown to include an inductive load flyback clamping diode 152 and an inverse conduction prevention circuit 150 in the form of a Schottky diode, as will be described. Like the circuit of FIG. 5, the sink driver circuit of FIG. 9 includes an NPN primary driver transistor 160 having a collector connected to the output terminal 164 of the driver circuit, an emitter connected to a supply voltage bus, such as ground, and a base. An NPN pre-driver transistor 162 has a collector connected to the collector of transistor 160, an emitter connected to the base of transistor 160 and a base. Base-to-emitter resistors 166 and 168 are connected between the base and emitter of respective transistors 160 and 162, as shown.

A first current source 170 has a first terminal connected to a supply voltage bus, such as $V_{CC}$, a second terminal connected to the base of primary driver transistor 160 and a third, control terminal. A second current source 172 has a first terminal connected to a supply voltage bus, such as $V_{CC}$, a second terminal connected to the base of pre-driver transistor 162 and a third, control terminal. The control terminals of each of the current sources 170 and 172 are interconnected and are further connected to an input terminal 176.

As should be apparent, the sink driver circuit of FIG. 9 is similar to the circuit of FIG. 5, with the exception that the circuit of FIG. 9 additionally includes the inverse conduction prevention circuit 150 and the clamp 152. The clamp 152 is provided by a diode having an anode connected to the output terminal 164 and a cathode connected to a supply voltage bus, such as $V_{BB}$ as illustrated. The clamp diode 152 prevents the output voltage at terminal 164 from exceeding the supply voltage $V_{BB}$ by more than one diode drop, as may be particularly advantageous when the load is inductive and the driver circuit is turned off.

The inverse conduction prevention circuit 150 prevents the pre-driver transistor 162 from diverting base current from the driver transistor 160. Recall that in the circuit of FIG. 5, when the primary driver transistor 70 is saturated, the pre-driver transistor 72 becomes conductive in the inverse mode and will divert some of the current from current source $I_1$ away from the base of transistor 70 in accordance with its inverse gain. The Schottky diode 150 in the circuit of FIG. 9 prevents this occurrence by diverting base current $I_2$ away from the pre-driver transistor 162.

More particularly, when the primary driver transistor 160 is in saturation, the collector of transistor 162 is at a lower voltage potential of $V_{SAT}$, than the emitter of transistor 162 which is at one $V_{BE}$ above ground. In the absence of the Schottky diode 150, the current source $I_2$ would forward bias the collector junction of transistor 162 rendering it conductive in the inverse mode. However, when Schottky diode 150 is included in the circuit, because it has a lower forward voltage than the forward biased collector junction voltage of transistor 162 (i.e., typically lower by 0.1 to 0.4 volts), the Schottky diode will forward bias before the collector junction of transistor 162 and will divert the current from current source $I_2$ to the collector of transistor 160 where it is conducted by transistor 160 to ground. Thus, the Schottky diode effectively clamps the base-to-collector voltage of transistor 162 to a low enough voltage to prevent this collector junction from becoming forward biased, thereby preventing transistor 162 from conducting in the inverse mode.

Once the primary driver transistor 160 comes out of saturation to a point where the output voltage exceeds $2V_{BE}$ minus the forward voltage of the Schottky diode 150, the Schottky diode 150 will cease to divert current $I_2$ and the emitter junction of transistor 162 will forward bias rendering transistor 162 conductive, thus allowing transistor 162 to provide additional base drive to transistor 160. With this arrangement, current $I_2$ is diverted away from the base of the pre-driver transistor 162 while the output voltage is below $2V_{BE}$ minus the forward voltage of the Schottky diode 150, and thereafter ceases to be diverted, enabling the pre-driver transistor 162 to supply additional base current to the primary driver transistor 160.

The $I_{OUT}$ v. $V_{OUT}$ characteristic associated with the circuit of FIG. 9 is represented by the dot/dash curve 93 in FIG. 6. As previously discussed, the $V_{OUT}$ level at which the current $I_2$ ceases to be diverted from the pre-driver transistor 162, and thus the degree to which curve 93 deviates from curve 94, is dependent on the forward voltage of the Schottky diode 150, including the component of forward voltage due to the Schottky diode's intrinsic series resistance. More specifically, the lower the forward voltage of the Schottky diode, the more curve 93 will deviate from curve 94. In practice, the size of Schottky diode 150 may be made small, thereby increasing its forward voltage and minimizing the deviation of curve 93 from the more optimal curve 94. Alternatively, a resistor may be placed in series with the Schottky diode to increase the effective voltage drop. To avoid significant inverse conduction of transistor 162, the forward voltage of the Schottky diode 150, including any voltage drops due to series resistance, need only be approximately 100 mV to 200 mV lower than the voltage required to forward bias the collector junction of transistor 162.

Figure 10:
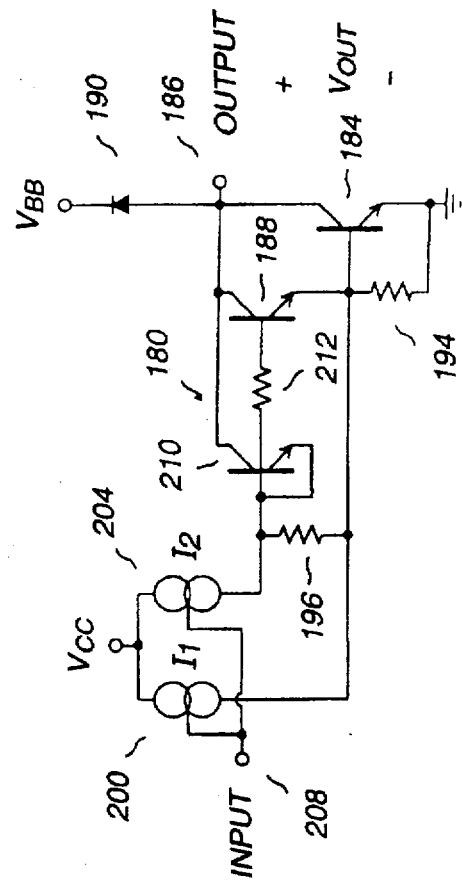
FIG. 10 shows a further alternate embodiment of the sink driver circuit of FIG. 5.

Referring also to FIG. 10, another alternate embodiment of the sink driver circuit of FIG. 5 is shown to include an alternative inverse conduction prevention circuit 180. Like the circuit of FIG. 5, the sink driver circuit of FIG. 10 includes an NPN driver transistor 184 having an emitter connected to ground, a collector connected to the output terminal 186 of the driver circuit and a base. An NPN pre-driver transistor 188 has a collector connected to the collector of driver transistor 184, an emitter connected to the base of driver transistor 184 and a base. Resistor 194 is connected between the base and emitter of transistor 184. Each of a pair of current sources 200 and 204 has a first terminal connected to a supply voltage bus, such as $V_{CC}$, and a second terminal connected to a respective one of transistors 184 and 210, respectively. A third, control terminal of each of the current sources 200 and 204 is connected to an input terminal 208. The current sources 200 and 204 are responsive to an input signal applied to the input terminal 208 for turning on and off. A clamp diode 190 has its anode connected to the output terminal 186 of the driver circuit and a cathode connected to the supply voltage bus $V_{BB}$ in order to clamp the output voltage to within one diode drop of the supply voltage $V_{BB}$, as described above in conjunction with like diode 152 in FIG. 9.

The inverse conduction prevention circuit 180 includes a series resistor 212 and a diode-connected NPN transistor 210, where the anode of the diode is formed by the interconnected base and emitter terminals of transistor 210 and the cathode of the diode is the collector terminal of transistor 210. Resistor 212 is further connected to the base of the pre-driver transistor 188. A resistor 196 is connected between the base of transistor 210 and the base of transistor 184, as shown.

The circuit 180 prevents the pre-driver transistor 188 from diverting substantial current away from the base of the driver transistor 184. More particularly, when the primary driver transistor 184 is in saturation, the voltage at its collector, as well as the collectors of transistors 188 and 210, is low, such as a few tenths of a volt. Under this condition, the base-collector junction of diode-connected transistor 210 as well as the base-collector junction of transistor 188 are forward biased when current source $I_2$ is on. However, with an appropriately selected value of resistor 212, the voltage drop across resistor 212 will cause most of the current $I_2$ to flow through the diode-connected transistor 210 to the collector of transistor 184 and to ground. Because most of current source $I_2$ is diverted, only a small amount of current will forward bias the collector junction of transistor 188. This small amount of base current will be multiplied by the reverse beta of transistor 188 and a resulting small amount of the current $I_1$ will be diverted from the base of transistor 184 by the inversely conducting transistor 188.

The relationship between the value of resistor 212 ($R_{212}$) and the value of the current flowing into the emitter of inversely conducting transistor 188 ($I_{E(188)}$) is given by:

$$R_{212} = (V_T * B_{R(188)} / I_{E(188)}) \ln\{(A_R * (I_2 * B_{R(188)} - I_{E(188)}) / ((B_{R(210)} + 1) * I_{E(188)})\}$$

where $V_T$ is a constant equal to approximately 25.8 mV at 300 degrees Kelvin, $A_R$ is the ratio of the area (size) of transistor 188 to the area (size) of transistor 210 (i.e. $A_R = A_{(188)} / A_{(210)}$), and $B_{R(210)}$ and $B_{R(188)}$ are the reverse betas of transistors 210 and 188, respectively. As an example, if $I_2 = 1.5$ mA, $A_R = 4$, $B_{R(210)} = B_{R(188)} = 10$ for $V_{EC} = 0.7$ volts, and we are willing to accept a maximum 1.5 mA of diverted current $I_{E(188)}$, then resistor 212 is calculated to be approximately 150 Ohms. Because current $I_1$ is typically 10–40 times greater than current $I_2$, or between 15 to 60 mA in the illustrative case, the diverted 1.5 mA current is small and results in no appreciable affect on the voltage drop of transistor 184 when it is in saturation. Note that the amount of diverted current is greatest when the output voltage is at or near zero volts, which is when the output current is low and thus, some diversion of base current from transistor 184 is of no consequence. As the output current increases, and thus the output voltage increases, transistors 210 and 188 saturate in the inverse mode, resulting in a drop in their reverse betas, thereby decreasing the value of diverted current in accordance with the previously discussed equation.

Once transistor 184 comes out of saturation, and the output voltage is at a level such that the base-to-emitter voltage of pre-driver transistor 188 is greater than the base-to-collector voltage of transistor 210, then the emitter junction of transistor 188 will forward bias, and transistor 188 will begin to conduct providing additional base drive current to the driver transistor 184. When the output voltage rises to a level such that the sum of the base-to-emitter voltage of pre-driver transistor 188 and the product of $I_2$ times resistor 212 is greater than the base-to-collector voltage of transistor 210, then diode-connected transistor 210 will cease to conduct and all of the current $I_2$ will become base current for the pre-driver transistor 188. To minimize the output voltage at which this occurs, it is desirable to make resistor 212 as small as possible. Thus, resistor 212 is typically chosen as a compromise between the level of diverted base current and the output voltage at which all of current $I_2$ becomes base current for transistor 188. Typically the product of current $I_2$ and resistor 212 is selected to be in the range of 100–200 mV.

Because the $V_{OUT}$ voltage at which current source $I_2$ ceases to be diverted is similar for the circuits of FIGS. 9 and 10, the $I_{OUT}$ v. $V_{OUT}$ characteristic associated with the circuit of FIG. 10 is similar to the circuit of FIG. 9 and is also represented by the dot/dash curve 93 in FIG. 6.

Figure 11:
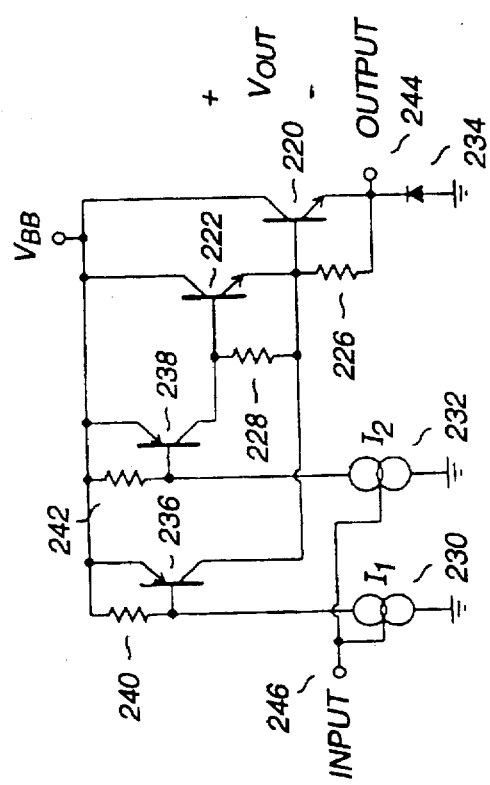
FIG. 11 shows a source driver circuit in accordance with an embodiment of the invention.

Referring to FIG. 11, a source driver circuit in accordance with the invention is shown to include an NPN driver transistor 220 having a collector connected to a supply voltage bus, such as $V_{BB}$ as illustrated, an emitter connected to an output terminal 244 of the driver circuit and a base. An NPN pre-driver transistor 222 has a collector connected to the collector of the driver transistor 220, an emitter connected to the base of driver transistor 220 and a base. Base-to-emitter resistors 226 and 228 are connected between the base and emitter of respective transistors 220 and 222, as shown.

The source driver circuit of FIG. 11 further includes a pair of current sources 230 and 232, supplying respective currents $I_1$ and $I_2$. The first current source 230 has a first terminal connected to the base of a PNP transistor 236, a second terminal connected to a supply voltage bus, such as ground, and a third, control terminal. Similarly, the second current source 232 has a first terminal connected to the base of a PNP transistor 238, a second terminal connected to a supply voltage bus, such as ground, and a third, control terminal. The control terminals of the current sources 230 and 232 are interconnected and are further connected to an input terminal 246. As in the previous embodiments, the current sources 230 and 232 are responsive to an input signal applied to the input terminal 246 for turning on and off. Resistors 240 and 242 are connected between the base and emitter of PNP transistors 236 and 238, respectively.

A clamp diode 234 has an anode connected to ground and a cathode connected to the output terminal 244 of the driver circuit. The clamp diode 234 operates to clamp the output voltage at terminal 244 to a voltage not less than one diode drop below ground. More particularly, if the output voltage goes more than a diode drop below ground, clamp diode 234 becomes forward biased and clamps the voltage at the output terminal 244 to one diode drop below ground.

In operation, when the input signal applied to the input terminal 246 causes the current sources 230 and 232 to be turned on, the PNP transistors 236 and 238 are likewise turned on. Conducting transistor 236 supplies current to the base of driver transistor 220 and conducting transistor 238 supplies current to the base of pre-driver transistor 222.

More particularly, because $V_{BB}$ is typically a high voltage supply, the current sources $I_1$ and $I_2$ must be kept to a small value in order to avoid excessive power dissipation in the driver circuit of FIG. 11. Under relatively light load conditions, transistor 236 will saturate and transistor 220 will act as an emitter follower current gain stage, resulting in an output voltage, $V_{OUT}$, equal to the sum of the saturation voltage of transistor 236 and the base-to-emitter voltage drop of transistor 220. Under these conditions, the voltage across the emitter junction of transistor 222 is less than the voltage required to forward bias such emitter junction and consequently, transistor 222 is non-conductive.

Once the output current demand increases to the point where it exceeds current source $I_1$ times the beta product of transistor 236 and 220, i.e. $I_1 * \beta_{236} * \beta_{220}$, then $V_{OUT}$ will increase to the point that the voltage drop across the emitter junction of pre-driver transistor 222 will cause such junction to forward bias, thus rendering the pre-driver transistor 222 conductive. Under these conditions, the pre-driver transistor 222 begins to provide additional base drive current to the driver transistor 220, so as to enable high peak output currents to be supplied to a load connected to the output terminal 244, without disadvantageously requiring a large component of driver power dissipation due to the voltage drop across the current sources $I_1$ and $I_2$.

Referring also to FIG. 12, the $I_{OUT}$ v. $V_{OUT}$ characteristics associated with the prior art circuits of FIGS. 2 and 4 and the $I_{OUT}$ v. $V_{OUT}$ characteristics of the source driver circuit of FIG. 11 are shown. Dashed curve 250 illustrates the $I_{OUT}$ v. $V_{OUT}$ characteristics for the source driver circuit of FIG. 2. As is apparent, the circuit of FIG. 2 is unable to accommodate significant peak output currents. Recall that in order to accommodate high peak output currents, significant quiescent power dissipation would result due to the large value required for current $I_1$.

Curve 252 represents the $I_{OUT}$ v. $V_{OUT}$ characteristics of the Darlington-based source driver circuit of FIG. 4. While the Darlington-based circuit is able to achieve higher peak output currents than the circuit of FIG. 2, the value of $V_{OUT}$ at low to moderate levels of output current is greater than that associated with the circuit of FIG. 2. Thus, the circuit of FIG. 4 has a greater power dissipation at low to moderate levels of output current.

The $I_{OUT}$ v. $V_{OUT}$ characteristics the source driver circuit of FIG. 11 is illustrated by the solid line curve 254. A comparison of curve 254 with curves 250 and 252 reveals that the circuit of FIG. 11 is capable of sourcing greater peak output currents, with a reasonable output voltage, than the circuits of FIGS. 2 and 4. Moreover, the output voltage $V_{OUT}$ of the circuit of FIG. 11 is lower than that associated with the Darlington-based circuit of FIG. 4, resulting in substantially lower power dissipation at low to moderate output current operating conditions. Thus, the circuit of FIG. 11 is particularly well suited for high output current demands of short duration. This is because the average power dissipation is dominated by the low output current characteristics.

Note that with the source driver circuit of FIG. 11, base current is not diverted from the primary driver transistor 220 by the pre-driver transistor 222 since transistor 238 can only pull the base voltage of transistor 222 to $V_{BB}$. Thus, the collector junction of transistor 222 will not forward bias and transistor 222 will not conduct in the inverse mode.

By comparing the source driver circuit waveform 254 of FIG. 12 with the sink driver circuit waveform 94 of FIG. 6, it becomes apparent that the value of $V_{OUT}$ associated with the source driver circuit is greater than that associated with the sink driver circuit over the entire operating range. This is because the lowest value of $V_{OUT}$ for the circuit of FIG. 11 is equal to $V_{BE}$; whereas $V_{OUT}$ of the circuit of FIG. 9 approaches zero. Commonly the PNP transistors realized on a monolithic IC process are lateral devices that have limited beta, particularly at high current densities. It is in just such a case that the circuits of FIGS. 11 and 13 are of greatest use because the NPN transistors provide sufficient gain to obtain meaningful output current levels.

Figure 13:
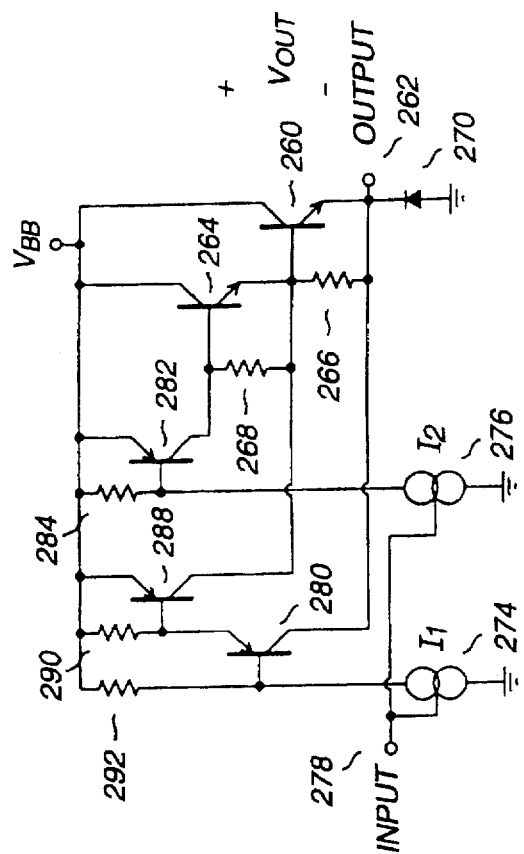
FIG. 13 shows an alternate embodiment of the source driver circuit of FIG. 11.

Referring to FIG. 13, a further embodiment of the source driver circuit of FIG. 11 is shown to include an alternative current source arrangement for supplying base drive current to the driver transistor 260 and pre-driver transistor 264. Like the source driver circuit of FIG. 11, the circuit of FIG. 13 includes an NPN driver transistor 260 having a collector connected to a supply voltage bus, such as the illustrated $V_{BB}$, an emitter connected to an output terminal 262 of the driver circuit and a base. A pre-driver transistor 264 has a collector connected to the collector of driver transistor 260, an emitter connected to the base of driver transistor 260 and a base. Resistors 266 and 268 are connected between the base and emitter of driver transistor 260 and pre-driver transistor 264, respectively, as shown.

Also provided is a clamp diode 270 which is connected and operable in the same manner as the clamp diode 234 described above in conjunction with FIG. 11. A pair of current sources 274 and 276 independently supply base drive current to the driver transistor 260 and the pre-driver transistor 264, respectively. More particularly, each of the current sources 274 and 276 has a first terminal connected to the base of a respective PNP transistor 280 and 282, a second terminal connected to ground and a third, control terminal. In the same manner as the previously described embodiments, the control terminals of each of the current sources 274 and 276 are interconnected and are further connected to an input terminal 278. The current sources 274 and 276 are responsive to an input signal applied to the input terminal 278 for selectively turning on and off. The emitter of transistor 280 is connected to the base of a transistor 288, the collector of which is connected to the base of the driver transistor 260 and the emitter of which is connected to $V_{BB}$. Base-to-emitter resistors 284, 290 and 292 are connected between the base and emitter of respective transistors 282, 288 and 280, as shown.

The operation of the circuit of FIG. 13 is substantially identical to the circuit of FIG. 11 except that the addition of PNP transistor 280 in the embodiment of FIG. 13 (as contrasted to the circuit of FIG. 11) permits a lower value of current $I_1$ to be supplied by the current source 274 in order to supply the same base drive current to the driver transistor 260. This is because transistor 280 serves as a gain stage. Such lower current $I_1$ serves to reduce the power dissipation associated with the circuit, particularly if the supply voltage $V_{BB}$ has a high value.

Figure 14:
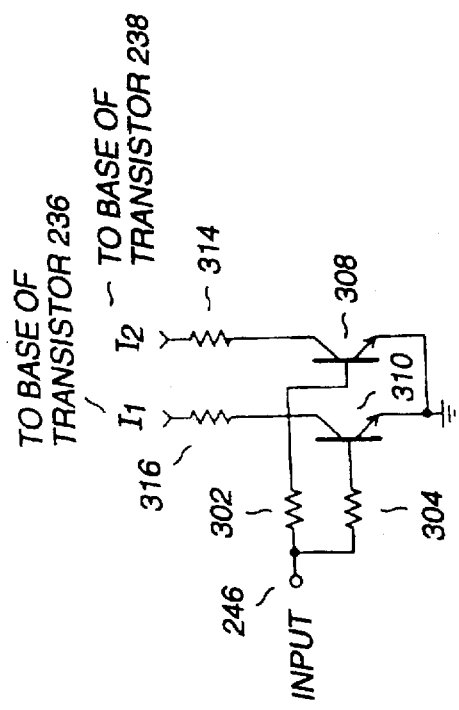
FIG. 14 shows an illustrative current source for use in the source driver circuit of FIG. 11.

Referring also to FIG. 14, an illustrative circuit for providing the current sources 230 and 232 of FIG. 11 is shown. In accordance with the embodiment of FIG. 14, the input terminal 246 is connected to a pair of resistors 302 and 304, each of which is further connected to the base of a respective NPN transistor 308 and 310. The emitter of each of transistors 308 and 310 is connected to ground. The collector of transistor 308 is connected to a resistor 314, which is further connected to the base of transistor 238 (FIG. 11) and the collector of transistor 310 is connected to a resistor 316, which is further connected to the base of transistor 236 (FIG. 11).

In operation, when the input signal applied to the input terminal 246 forward biases the emitter junction of transistors 308 and 310, such transistors conduct. In their conducting states, transistor 308 draws current $I_2$ through resistor 314 and transistor 310 draws current $I_1$ through resistor 316. The current source arrangement of FIG. 14 is particularly well suited for applications in which the value of the supply voltage $V_{BB}$ is known and constant. This is because the currents $I_1$ and $I_2$ are set primarily by the voltage $V_{BB}$ and the value of respective resistors 314 and 316, and secondarily by the base-to-emitter voltage ($V_{BE}$) and saturation voltage ($V_{SAT}$) of respective transistors 308 and 310.

Figure 15:
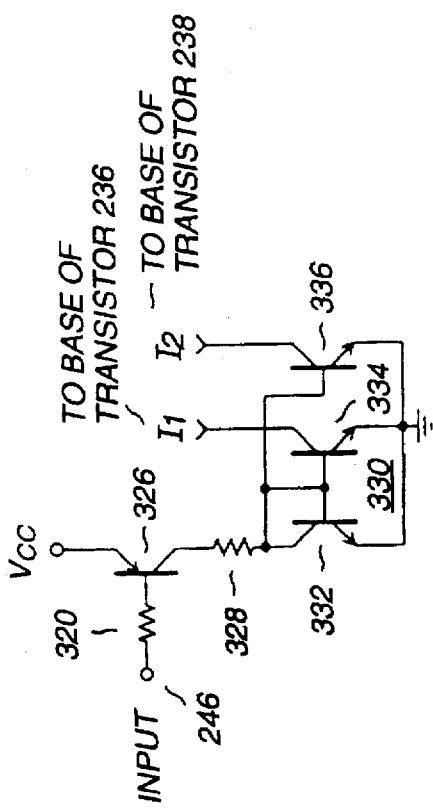
FIG. 15 shows an alternate current source for use in the source driver circuit of FIG. 11.

An alternative current source arrangement is shown in FIG. 15 to include a resistor 320 connected between the input terminal 246 and the base of a PNP transistor 326. The PNP transistor 326 has an emitter connected to a supply voltage bus, such as $V_{CC}$, and a collector connected to a resistor 328. A three transistor current mirror 330 includes NPN transistors 332, 334 and 336, as shown. The bases of each of the transistors 332, 334 and 336 are interconnected and are further connected to resistor 328. The transistors 332, 334 and 336 have interconnected emitters which are further connected to ground. The collector of transistor 332 is connected to its base. The collector of transistor 334 is connected to the base of transistor 236 (FIG. 11) and the collector of transistor 336 is connected to the base of transistor 238 (FIG. 11).

In operation, when the input signal applied to the input terminal 246 forward biases the emitter-to-base junction of transistor 326, transistor 326 conducts. With transistor 326 conducting, a current is developed through the series path including transistor 326, resistor 328 and transistor 332. This current establishes the base-to-emitter voltage for the transistors 334 and 336, so as to cause such transistors to conduct currents proportional to the current through transistor 332. More particularly, current $I_1$ flows through transistor 334 and current $I_2$ flows through transistor 336. The values of currents $I_1$ and $I_2$ are a function of the current through transistor 332, as well as the relative geometries of the three transistors of the current mirror 330.

The current source arrangement of FIG. 15 is particularly well suited for applications in which the value of the supply voltage $V_{BB}$ is either unknown or varying. This is because the current through transistors 326 and 332, as well as the relative geometries of transistors 332, 334 and 336 determine the currents $I_1$ and $I_2$ and, since the level of $V_{CC}$ is generally constant, the current through transistors 326 and 332 will likewise tend to be relatively constant.

Figure 16:
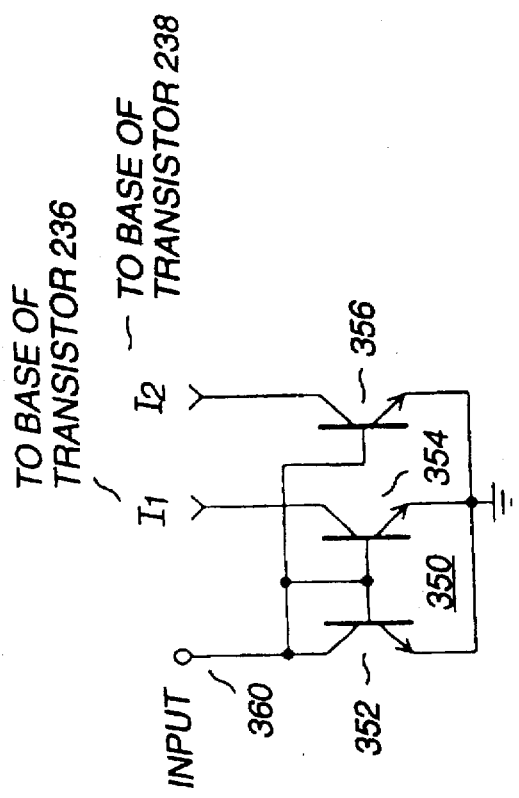
FIG. 16 shows a further alternate current source for use in the source driver circuit of FIG. 11.

Referring also to FIG. 16, a further alternate circuit for implementing current sources 230 and 232 of FIG. 11 is shown. The circuit of FIG. 16 is similar to that of FIG. 15, in that it includes a current mirror 350 having three NPN transistors 352, 354 and 356. The bases of transistors 352, 354 and 356 are interconnected, as are the emitters of such transistors, as shown. The collector of transistor 352 is connected to an input terminal 360. The collector of transistor 354 is connected to the base of PNP transistor 236 (FIG. 11) for drawing a current $I_1$ and the collector of transistor 356 is connected to the base of transistor 238 (FIG. 11) for drawing a current $I_2$.

The current source circuit of FIG. 16 is responsive to a current input signal applied to the input terminal 360, as contrasted to the voltage input signal to which the previously described circuits are responsive. To this end, the input signal applied to the input terminal 360 provides a predetermined amount of current through transistor 352, which is mirrored through transistors 354 and 356. The currents through transistors 354 and 356 (i.e., currents $I_1$ and $I_2$) are determined by the current level of the input signal and the relative geometries of the transistors of the current mirror 350. It will be appreciated that any of the previously described circuits may utilize a current input signal arrangement like the circuit of FIG. 16, as opposed to being responsive to a voltage input signal. It will also be appreciated that various circuits are suitable for implementing the current sources 230 and 232 (FIG. 11), in addition to the circuits shown and described in conjunction with FIGS. 14, 15 and 16.

As previously discussed, the source driver circuits of FIGS. 11 and 13 are most useful when high beta PNP transistors are not available in the circuit, as is the case for many monolithic IC processes. If, on the other hand, high beta PNP transistors are available as circuit elements, then a source driver circuit comprised of two PNP devices and two current sources may be constructed as shown in FIG. 17.

Figure 17:
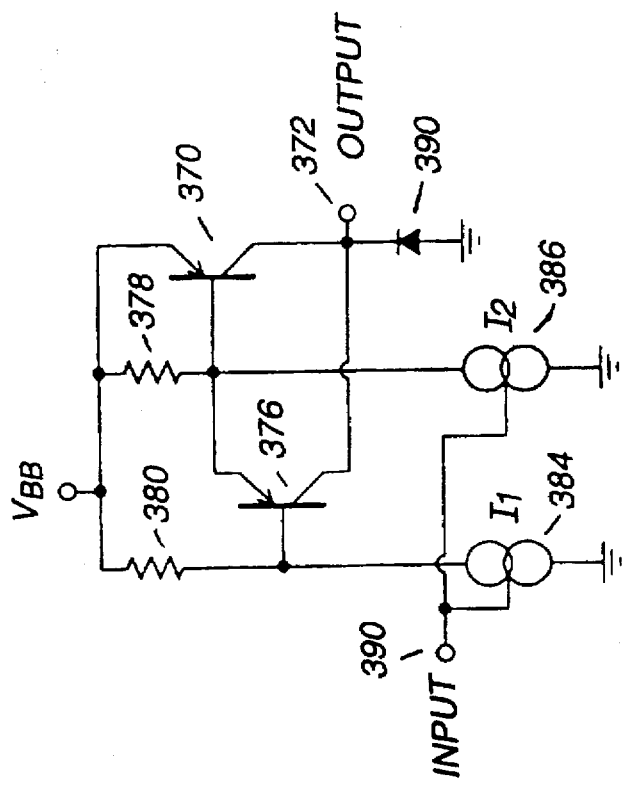
FIG. 17 shows an alternate source driver circuit utilizing PNP transistors.

More particularly, the source driver circuit of FIG. 17 includes a driver PNP transistor 370 having a collector connected to the output terminal 372 of the circuit, an emitter connected to a supply voltage bus, such as $V_{BB}$, and a base. A pre-driver PNP transistor 376 has an emitter connected to the base of the driver transistor 370, a collector connected to the collector of the driver transistor 370 and a base. Base-to-emitter resistors 378 and 380 are connected between the base and emitter of respective transistors 370 and 376. A first current source 384 has a first terminal connected to the base of the pre-driver transistor 376, a second terminal connected to ground and a third, control terminal. Similarly, a second current source 386 has a first terminal connected to the base of the driver transistor 370, a second terminal connected to ground and a third, control terminal. The control terminals of current sources 384 and 386 are commonly connected to an input terminal 390, as shown. A clamp diode 392 is provided in order to prevent the output voltage of the circuit from going more than a diode drop below ground.

The circuit of FIG. 17 operates in an analogous manner to the sink driver circuit of FIG. 5 in that, when an input signal applied to terminal 390 turns on the current sources 384 and 386, transistors 376 and 370 are caused to conduct. With this arrangement, output current is sourced through transistors 370 and 376 to a load connected to the output terminal 372.

Source driver circuits including a means to prevent inverse conduction of the pre-driver transistor, which are analogous to the sink driver circuit counterparts of FIGS. 9 and 10, may also be constructed using highbeta PNP transistors. More particularly, the source driver circuit of FIG. 18 includes a PNP driver transistor 400 having a collector connected to the output terminal 402 of the circuit, an emitter connected to supply voltage $V_{BB}$ and a base. A pre-driver transistor 406 has a collector connected to a collector of the driver transistor 400, an emitter connected to the base of driver transistor 400 and a base. Base-to-emitter transistors 408 and 410 are connected between the base and emitter of respective transistors 400 and 406, as shown.

First and second current sources 414 and 416 are connected to respective transistors 406 and 400. More particularly, the first current source 414 has a first terminal connected to the base of pre-driver transistor 406, a second terminal connected to ground and a third, control terminal. Similarly, the second current source 416 has a first terminal connected to the base of transistor 400, a second terminal connected to ground and a third, control terminal. The control terminals of current sources 414 and 416 are commonly connected to the input terminal 420, as shown. A clamp diode 422 is provided in order to prevent the output voltage of the circuit from falling more than one diode drop below ground.

Figure 18:
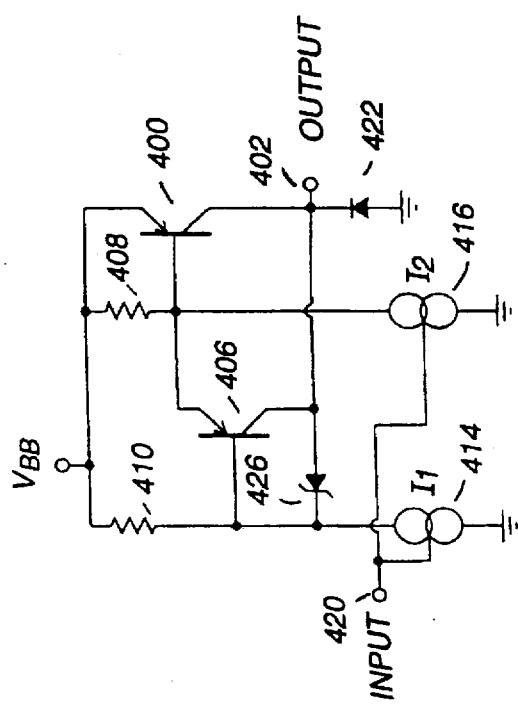
FIG. 18 shows an alternate embodiment of the source driver circuit of FIG. 17.

The circuit of FIG. 18 differs from that of FIG. 17 in that an inverse conduction prevention device 426 is provided in order to prevent the pre-driver transistor 406 from diverting base current away from the driver transistor 400. To this end, a Schottky diode 426 is provided having an anode connected to the collector of pre-driver transistor 406 and a cathode connected to the base of pre-driver transistor 406. The circuit of FIG. 18 operates generally in the same manner as the circuit of FIG. 9 which includes a like inverse conduction prevention device in order to prevent base current from being diverted from the driver transistor 400.

Figure 19:
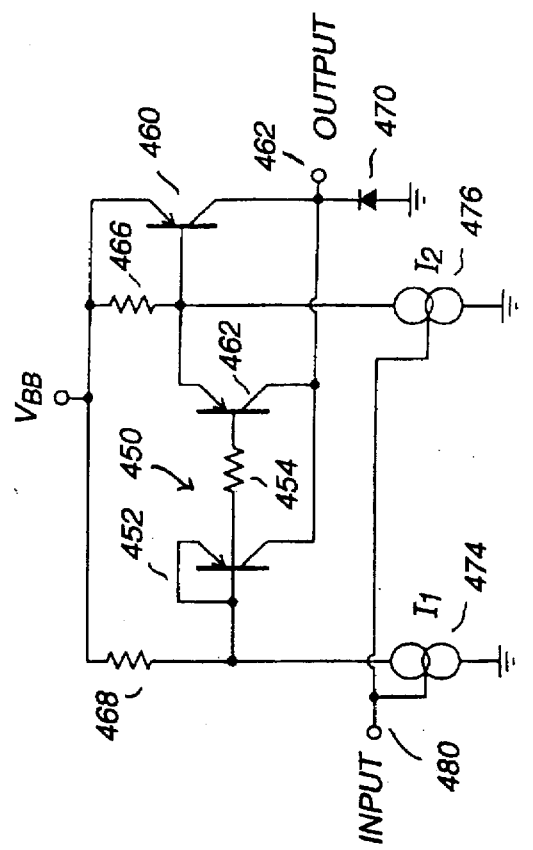
FIG. 19 shows a further alternate embodiment of the source driver circuit of FIG. 17.

FIG. 19 shows an alternate embodiment of a PNP based source driver circuit including an inverse conduction prevention circuit. In particular, the inverse conduction prevention circuit 450 includes a diode-connected transistor 452 and a series connected resistor 454, like similar components 210 and 212 of FIG. 10.

More particularly, the source driver circuit of FIG. 19 includes an NPN driver transistor 460 having a collector connected to an output terminal 462 of the circuit, an emitter connected to a supply voltage $V_{BB}$ and a base. A pre-driver transistor 462 has an emitter connected to the base of transistor 460, a collector connected to the collector of transistor 460 and a base. A base-to-emitter resistor 466 is connected between the base and emitter of transistor 460. Another resistor 468 is connected between the diode-connected transistor 452 and the supply voltage bus $V_{BB}$, as shown. A clamp diode 470 is connected between the output terminal 462 and ground in order to prevent the output voltage from falling more than a diode drop below ground, as discussed above. A first current source 474 has a first terminal connected to the diode-connected transistor 452, a second terminal connected to ground and a third, control terminal. A second current source 476 similarly has a first terminal connected to the base of the driver transistor 460, a second terminal connected to ground and a third, control terminal. The control terminals of current sources 474 and 476 are commonly connected to the input terminal 480, as shown. FIG. 19 operates in a manner analogous to the circuit of FIG. 10 which includes a like inverse conduction prevention device to prevent base current from being diverted from the driver transistor 460.

The PNP based circuits of FIGS. 17, 18 and 19 are of particular use when the voltage drop across current source $I_1$ is not too great, thereby allowing $I_1$ to be of sufficient value to saturate the PNP driver transistor without creating excessive power dissipation due to the voltage drop across current source $I_1$.

Having described the preferred embodiments of the invention, it will now become apparent to one of skill in the art that other embodiments incorporating their concepts may be used. It is felt therefore that these embodiments should not be limited to disclosed embodiments but rather should be limited only by the spirit and scope of the appended claims.

We claim:

1. A bipolar driver circuit including a primary driver transistor having a collector and an emitter, one of which is connected to an output terminal of said bipolar driver circuit, and a base and a pre-driver transistor having an emitter connected to the base of said primary driver transistor, a collector connected to the collector of said primary driver transistor and a base, said bipolar driver circuit comprising:

a first current source connected to the base of said pre-driver transistor;

a second current source connected to the base of said primary driver transistor; and an input terminal responsive to an input signal for substantially simultaneously turning on said first and second current sources and for substantially simultaneously turning off said first and second current sources.

2. The bipolar driver circuit recited in claim 1 wherein said primary driver transistor and said pre-driver transistor are NPN transistors.

3. The bipolar driver circuit recited in claim 1 wherein the collector of said primary driver transistor is connected to said output terminal of said bipolar driver circuit.

4. The bipolar driver circuit recited in claim 3 further comprising an inverse conduction prevention circuit coupled to the base of said pre-driver transistor for preventing said pre-driver transistor from conducting current from the emitter to the collector thereof.

5. The bipolar driver circuit recited in claim 4 wherein said inverse conduction prevention circuit comprises a diode-connected transistor in series with a resistor and with said base of said pre-driver transistor.

6. The bipolar driver circuit recited in claim 4 wherein said inverse conduction prevention circuit comprises a Schottky diode connected between said base and said collector of said pre-driver transistor.

7. The bipolar driver circuit recited in claim 1 wherein the emitter of said primary driver transistor is connected to said output terminal of said bipolar driver circuit.

8. The driver circuit recited in claim 1 wherein said first and second current sources are responsive to a common input signal for turning on and off.

9. A bipolar driver circuit having an output terminal for coupling to a load, said bipolar driver circuit comprising:
   a primary driver transistor having a collector and an emitter, one of which is connected to said output terminal, and a base;
   a pre-driver transistor having a collector connected to said collector of said primary driver transistor, an emitter connected to said base of said primary driver transistor and a base;
   a first current source connected to said base of said primary driver transistor;
   a second current source connected to said base of said pre-driver transistor; and
   an input terminal responsive to an input signal for substantially simultaneously turning on said first and second current sources and for substantially simultaneously turning off said first and second current sources.

10. The bipolar driver circuit recited in claim 9 wherein said driver transistor and said pre-driver transistor are NPN transistors.

11. The bipolar driver circuit recited in claim 9 wherein said collector of said primary driver transistor is connected to said output terminal of said bipolar driver circuit.

12. The bipolar driver circuit recited in claim 11 further comprising an inverse conduction prevention circuit coupled to the base of said pre-driver transistor for preventing said pre-driver transistor from conducting current from the emitter to the collector thereof.

13. The bipolar driver circuit recited in claim 12 wherein said inverse conduction prevention circuit comprises a diode-connected transistor in series with a resistor and with said base of said primary driver transistor.

14. The bipolar driver circuit recited in claim 12 wherein said inverse conduction prevention circuit comprises a Schottky diode connected between said base and said collector of said pre-driver transistor.

15. The bipolar driver circuit recited in claim 9 wherein said emitter of said primary driver transistor is connected to said output terminal of said bipolar driver circuit.

16. The driver circuit recited in claim 9 wherein said first and second current sources are responsive to a common input signal for turning on and off.

17. A bipolar driver circuit including a primary transistor having a collector and an emitter, one of which is connected to an output terminal of said bipolar driver circuit, and a base and a pre-driver transistor having an emitter connected to the base of said primary driver transistor, a collector connected to the collector of said primary driver transistor and a base, said bipolar driver circuit comprising:
   a first current source connected to the base of said pre-driver transistor;
   a second current source connected to the base of said primary driver transistor; and
   an input terminal responsive to an input signal for substantially simultaneously turning on said first and second current sources and for substantially simultaneously turning off said first and second current sources; wherein said first and second current sources are responsive to a common input signal for turning on and off.

* * * * *